United States Patent [19]

Lang

[11] Patent Number: 5,164,956
[45] Date of Patent: Nov. 17, 1992

[54] MULTIPERIOD-GRATING SURFACE-EMITTING LASERS

[75] Inventor: Robert J. Lang, Altadena, Calif.

[73] Assignee: The United States of America as represented by the Administrator of the National Aeronautics and Space Administration, Washington, D.C.

[21] Appl. No.: 782,009

[22] Filed: Oct. 21, 1991

[51] Int. Cl.$^5$ .............................................. H01S 3/19
[52] U.S. Cl. ......................................... 372/96; 372/20; 372/108
[58] Field of Search .................. 372/96, 108, 20, 44, 372/45, 46, 50

[56] References Cited

U.S. PATENT DOCUMENTS

| | | | |
|---|---|---|---|
| 4,803,696 | 2/1989 | Pepper et al. | 372/95 |
| 4,815,087 | 3/1989 | Hayashi | 372/45 |
| 4,993,036 | 2/1991 | Ikeda et al. | 372/96 |

OTHER PUBLICATIONS

A. Hardy, et al., "Analysis of Second-Order Gratings," J. of Quantum Electronics, vol. 25, No. 10, pp. 2096–2105, Oct., 1989.
D. F. Welch, et al., "Low-Threshold Grating-Coupled Surface-Emitting Lasers," Appl. Phys. Lett., 55(9), pp. 813–815, Aug. 28, 1989.
Y. Nomura, et al., "GaAs/AlGaAs Distributed Feedback Structure with Multiquantum Well for Surface-Emitting Laser," J. Appl. Phys., 60(3), pp. 874–877, Aug. 1, 1986.
M. Y. A. Raja, et al., "Surface-Emitting, Multiple Quantum Well GaAs/AlGaAs Laser with Wavelength-Resonant Periodic Gain Medium," Appl. Phys. Lett., 53(18), pp. 1678–1680, Oct. 31, 1988.
D. F. Welch, et al., "High Power, 16W, Grating Surface Emitting Laser with a Superlattice Substrate Reflector," Electronics Letters, vol. 26, No. 11, pp. 757–758, May 24, 1990.
D. F. Welch, et al., "High-Power, 4W Pulsed, Grating-Coupled Surface-Emitting Laser," Electronics Letters, vol. 25, No. 16, pp. 1038–1039, Aug. 3, 1989.
D. F. Welch, et al., "High-Power Grating-Coupled Surface Emitters," Electronics Letters, vol. 25, No. 13, pp. 819–820, Jun. 22, 1989.

Primary Examiner—James W. Davie
Attorney, Agent, or Firm—John H. Kusmiss; Thomas H. Jones; Guy M. Miller

[57] ABSTRACT

Surface-emitting distributed feedback (DFB) lasers are disclosed with hybrid gratings. A first-order grating is provided at one or both ends of the active region of the laser for retroreflection of light back into the active region, and a second-order or nonresonant grating is provided at the opposite end for coupling light out perpendicular to the surface of the laser or in some other selected direction. The gratings may be curved to focus light retroreflected into the active region and to focus light coupled out to a point P. When so focused to a point, the DFB laser may be part of a monolithic read head for a laser recorded disk, or an optical coupler into an optical fiber.

18 Claims, 5 Drawing Sheets

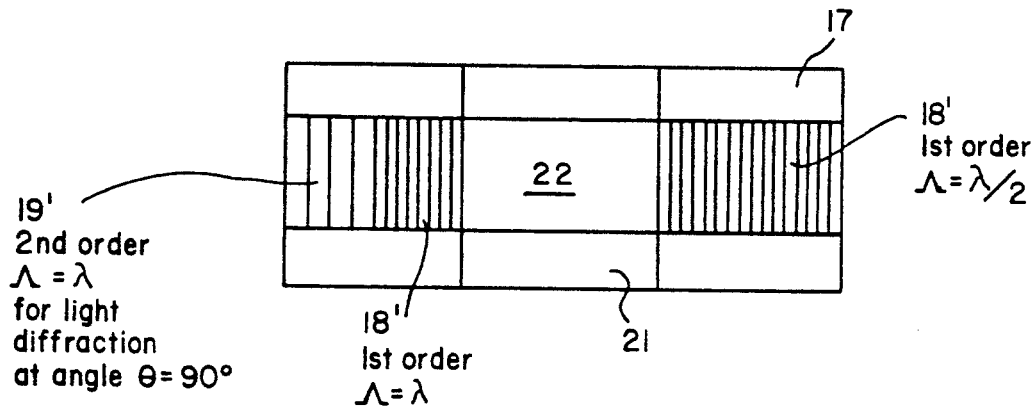
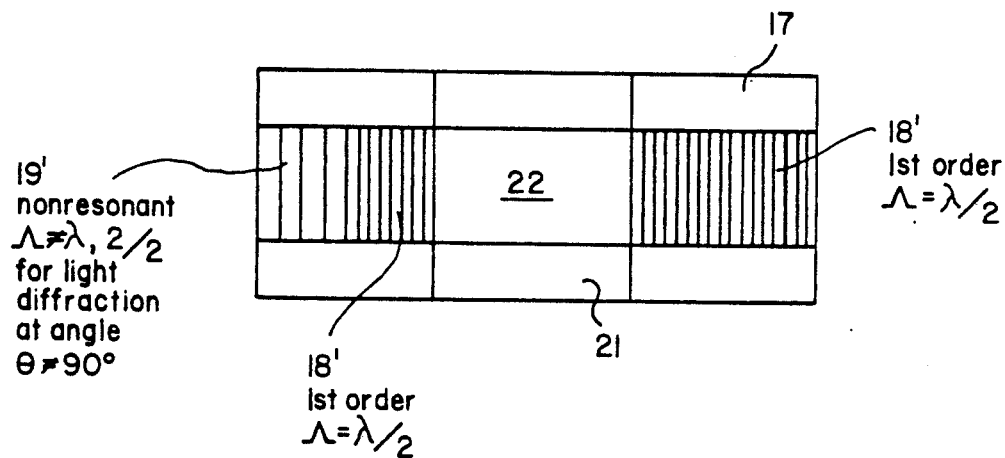
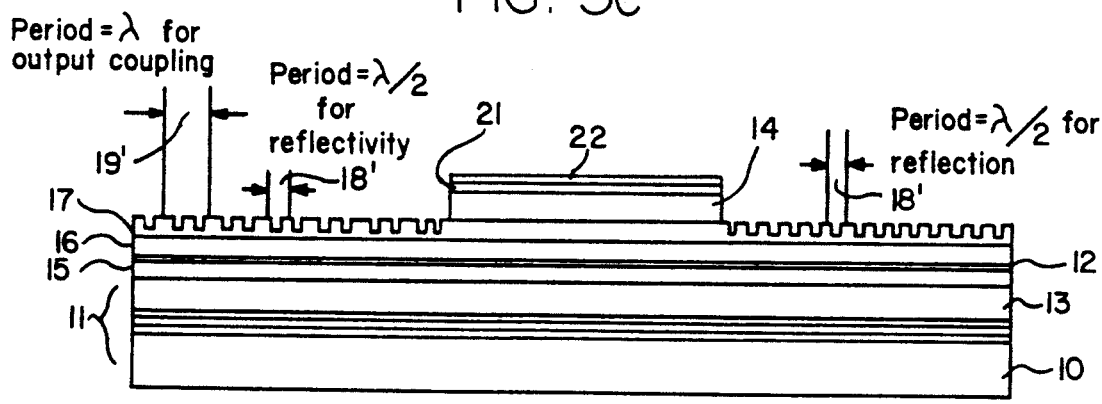

MULTIPERIOD-GRATING SURFACE-EMITTING LASERS

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

This invention relates to the art of grating-coupled, surface-emitting, distributed feedback (DFB) lasers and more particularly to improvements pertaining to coupling high-intensity focused light out of such DFB lasers.

BACKGROUND ART

Grating-coupled, surface-emitting DFB lasers are desirable for high-power applications in the form of coupled arrays and, along with vertical-cavity lasers, as individual elements for optical interconnects. The latter have seen a great deal of development as they offer small size, low threshold and extremely large-scale integration possibilities but remain plagued by problems related to heating, series resistance, and require a very demanding layer structure. Grating lasers, while larger in size, also offer the potential for very low threshold operation while using a less demanding layer structure. In addition, by fabricating more complex grating structures, one may control the shape of the beam to a great degree in order to achieve, for example, steered and/or focused output beams. For these reasons, single-element, grating-coupled, surface-emitting DFB lasers offer great potential as sources for optical interconnects and large-scale optoelectronic integrated circuits.

A conventional single-element, grating-coupled, GaAs/GaAlAs surface-emitting DFB laser shown in FIG. 1 consists of a GaAs layer between AlGaAs cladding layers grown over a GaAs substrate. A cap layer of AlGaAs is etched on both ends down to or into the upper cladding layer. A diffraction grating is then etched in the upper cladding layer with a period (groove spacing) $\Lambda = \lambda$, where $\lambda$ is the wavelength of light in the cladding layer, to provide a second-order grating that will reflect light back into the active region and diffract light perpendicularly out.

Such a grating-coupled, surface-emitting laser suffers from low efficiency and high-threshold current because the same second-order grating with a groove spacing equal to the wavelength of the light in the laser material serves to diffract light upwardly out from the surface and to also diffract it downwardly into the substrate of the laser as indicated by arrows in FIG. 1. The portion of the second-order diffraction component of light diffracted downwardly into the substrate is absorbed and lost. This loss contributes to the low efficiency of grating-coupled, surface-emitting DFB lasers.

Attempts have been made to reduce these losses by removing the substrate from the laser and forming a partial reflector on the side of the waveguide previously occupied by the substrate to reflect light back up and vertically out. However, this is technologically difficult, and it decreases the mechanical stability of the device. A better solution is to provide a multilayer dielectric reflector between the substrate and the waveguide. However, full exploitation of the potential of single-element, grating-coupled, surface-emitting DFB lasers requires fabrication of multiple grating periods and shapes to optimally provide the functions of feedback, output coupling, and beam shaping to the laser.

STATEMENT OF THE INVENTION

An object of this invention is to lower threshold currents, increase quantum efficiencies and improve beamwidth of grating-coupled, surface-emitting DFB lasers. In addition to improving the shape of the beam, a further object is to achieve a steered and/or focused output beam.

A further object of this invention is to not only increase efficiency and lower the threshold of a single-element, grating-coupled, surface-emitting DFB laser, but to also increase the efficiency of coupling focused light out at some angle other than 90°, without the need for lenses.

To achieve these and other objects of this invention, hybrid grating structures are incorporated that utilize both first- and second-order gratings defined as periodic groove spacing $\Lambda$ matched to the wavelength and refractive index of the laser material such that $\Lambda = \lambda/2$ and $\Lambda = \lambda$ for respective first- and second-order gratings, where $\lambda$ is the wavelength of emitted light in the waveguide material to separately provide feedback and output coupling. Thus, by replacing a second-order grating with a first-order grating in an otherwise conventional single-element, grating-coupled DFB laser simultaneously improves the threshold current, quantum efficiency, and vertical single-lobe, farfield pattern and, by replacing the second-order grating at one end with a first-order grating and adding a second-order or nonresonant grating at one end, light is coupled in a vertical or nonvertical direction, i.e., at an angle $\theta$ equal to 90° from the plane of the active layer or at some other angle.

The relation between the angle of diffraction and the required period of the nonresonant grating may be determined from the Bragg relations:

$$\theta = \text{Arccos}\left(n - \frac{\lambda_o}{\Lambda}\right) \tag{1}$$

$$\Lambda = \frac{\lambda_o}{\cos\theta - n}$$

in which $\theta$ is the angle of diffraction, n is the effective index of refraction of the waveguide, $\lambda_o$ is the wavelength of the laser light in air, and $\Lambda$ is the local period of the nonresonant grating.

In the case of a first-order grating at one end and a second-order grating at the other end of the active region defined by a stripe contact through which current is injected, light retroreflected into the active region may be focused into the ends of the active region by curving the grating grooves. This curvature is to be chosen so that each groove, taken independently, retroreflects the incident beam into the active region of the laser. The radius of curvature is given approximately by the distance of the groove from the end of the stripe, such that all of the grooves are segments of concentric circles. A more accurate specification for the spacing of each groove is to so select the spacing of each groove as to provide lines of constant phase in the distribution of the optical field as it exits the active region. By focusing the retroreflected light, a narrower active region can be provided, thus reducing the chip area required and lowering the threshold of the laser. The narrower active region may also be made shorter (with possibly a greater number of quantum wells vertically stacked) in order to further reduce the chip area. In that case, a second-order grating may be provided at each end of the short active region in order to couple light out from both ends to form a larger diameter beam.

In the case of a first-order grating at each end of the active region defined by a long narrow contact, the gratings may be curved to focus retroreflected light into the narrow active region for a lower threshold. The second-order or nonresonant grating provided at one end may also be curved to focus the light coupled out to a point P directly over the output facet (i.e., the exit end of the active region under the contact stripe or at an arbitrary position above the laser surface).

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 2b illustrates graphs of optical power output of the two types of devices, one type as shown in FIG. 1 and the other type as shown in FIG. 2a.

FIG. 3a illustrates schematically a modification of the diffraction gratings in FIG. 2a wherein the diffraction grating at one end of the active region is partially first order and the balance is second order in order to increase light retroreflected into the active region and diffract light out at 90° from the surface of the laser.

FIG. 3b illustrates schematically a variation of the grating-coupled, surface-emitting DFB laser of FIG. 3a in which the diffraction grating is partially first order ($\Lambda=\lambda$) and the balance is a nonresonant grating ($\Lambda\neq\lambda,\lambda/2$) to diffract light out at an angle other than 90° from the surface of the laser.

FIG. 3c illustrates a technique for implementing a multiperiod grating at one end of the active region in which a first-order and a second-order grating are combined into one grating structure by alternating wide and narrow grooves, such that the widely-spaced grooves have a period $\lambda$ to provide coupling out, and the widely and narrowly-spaced grooves together provide a grating having an average period of $\lambda/2$ to retroreflect light into the active region of the laser.

DETAILED DESCRIPTION OF THE INVENTION

In all embodiments of the present invention illustrated in FIGS. 2a through FIG. 7 of the drawings, a surface-emitting DFB laser is provided with a multilayer waveguide comprised of one or more quantum wells (and a barrier layer between quantum wells in the case of multiple quantum wells) between two guiding layers. The multilayer waveguide extends beyond the active region defined by a stripe contact that has been provided for injection of current over an upper cladding layer that is etched at both ends leaving only a thin layer (approximately 0.15 $\mu$m) at both sides of the active region. This thin layer referred to herein as a "grating layer" may be grown as an integral part of the upper cladding layer, but in the preferred embodiment it is grown as a separate layer with an etch stop over it before growing the upper cladding layer in order to facilitate etching the upper cladding layer down to the etch stop. That leaves a uniformly thin grating layer into which diffraction gratings are then etched.

Figure 2A:
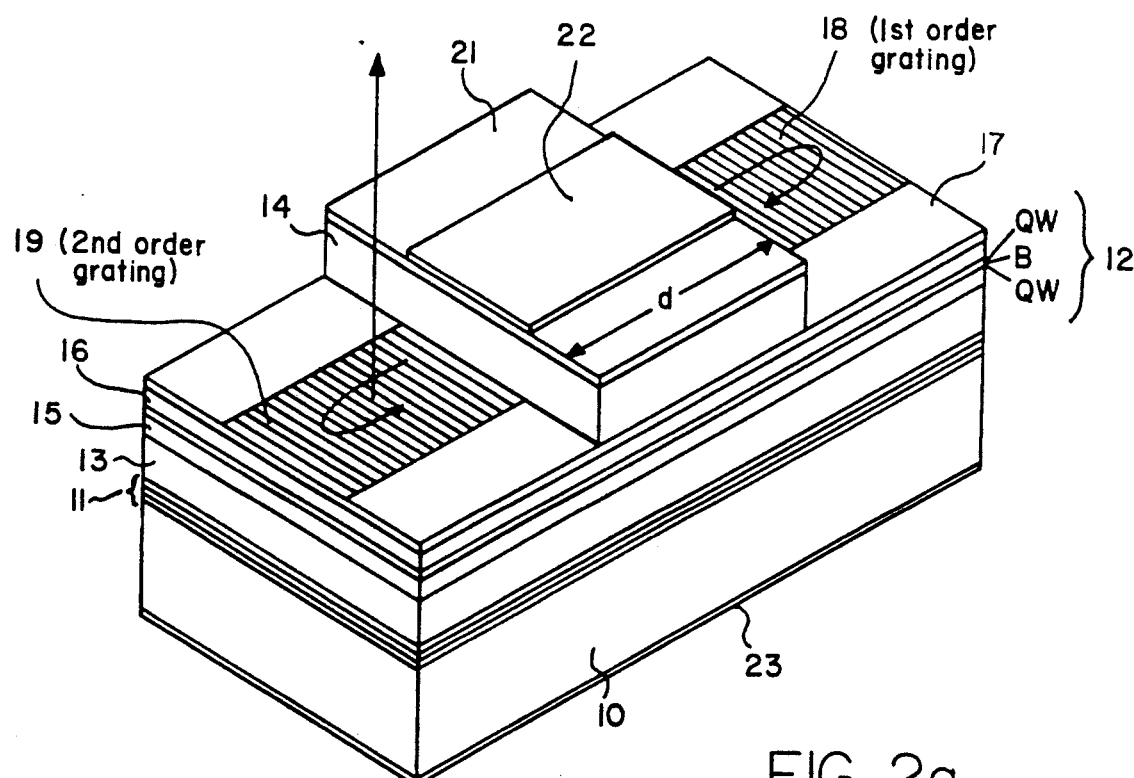
FIG. 2a illustrates an improved grating-coupled, surface-emitting DFB laser having a first-order grating (periodic groove spacing $\Lambda=\lambda/2$) at one end for diffraction of light only back into the active region of the laser and a second-order grating (groove spacing $\Lambda=\lambda$) for diffraction of light back into and perpendicularly out of the laser.

The basic structure for all embodiments will now be described in detail with reference to FIG. 2a. A high efficiency GaAs/GaAlAs surface-emitting, grating-coupled, ridge waveguide laser is formed on an n+-GaAs substrate 10 with a multilayer dielectric reflector 11 between the substrate and a double-heterostructure active layer 12 bounded on both sides by passive waveguide cladding layers 13 and 14, and graded refractive index (GRIN) layers 15 and 16 between the cladding layers 13 and 14. Thus, the active layer 12 is separated from the lower cladding layer 13 by a graded refractive index (GRIN) layer 15 (about 0.2 or 0.3 $\mu$m, $Al_{0.2-0.6}Ga_{0.8-0.4}As$). The active layer 12 is bounded on the upper side thereof by a GRIN layer 16 similar to the GRIN layer 15, thereby providing a waveguide for emitted light in the active layer 12. A grating layer 17 about 0.15 $\mu$m of p-$Al_{0.6}Ga_{0.4}As$ is grown over the upper GRIN layer 16.

Figure 5A:
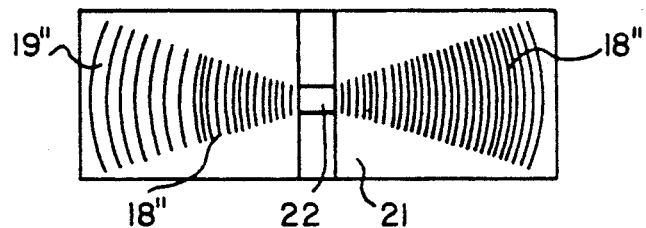
FIG. 5a illustrates another variation in which the narrower active region of the laser in FIG. 4 is made shorter. In this case, gratings at both ends may be second order for coupling out a broader beam of light.

The multilayer reflector 11 is comprised of ten or more pairs of quarter-wavelength high/low indices of refraction (e.g., 600 Å layers of $Ga_{0.6}Al_{0.4}As/-Ga_{0.8}Al_{0.2}As$). The lower cladding layer is comprised of 1.0 $\mu$m n-$Al_{0.6}Ga_{0.4}As$ (Si doped: $3\times10^{17}$ cm$^{-3}$). The double-heterostructure active layer 12 is comprised of a pair of 100 Å GaAs quantum wells (QW) separated by a 100 Å $Al_{0.2}Ga_{0.8}As$ barrier, (B), but for applications requiring a small length d of active region, such as illustrated in FIG. 5a, up to ten quantum wells separated by nine barrier layers may be required to provide sufficient optical gain.

In practice, the upper cladding layer 14 (about 1.0 $\mu$m of p-$Al_{0.6}Ga_{0.4}As$) may be grown and etched back in order to provide a grating layer with a surface close to the waveguide layer 16. The next step would be to etch the first-order and second-order diffraction gratings 18 and 19 into the grating layer 17, but it is preferred to grow an etch-stop layer 20 (about 100 Å of p-$Al_{0.3}Ga_{0.7}As$ Si doped: $3 \times 10^{17} cm^{-3}$) before growing the upper cladding layer 14 and a cap layer 21 of about 0.2 μm of $p^+$-GaAs. The etch stop 20 protects the full thickness of the grating layer 17 while etching the upper cladding layer 14 back to expose the grating layer 17 using sulfuric acid and hydrogen peroxide in a 1:8:8 solution. The gratings are formed by spinning 1000 Å of PMMA (poly-methyl-methacrylate) resist onto the wafer and forming the grating patterns by electron-beam exposure followed by development in MIBK (methyl isobutyl ketone). The various groove shapes described in the above claims may all be formed by varying the program that controls the electron beam lithography system. The pattern may be transferred from the resist to the semiconductor grating layer by wet etching in a sulfuric acid/peroxide solution; by ion milling; by reactive ion etching; or by chemically-assisted ion beam etching. Metalization of the stripe contact 22 and a back contact 23 completes fabrication of the device.

The etch stop consisting of $Al_{0.3}Ga_{0.7}AS$ is attacked by the same acid solution as used in etching the upper cladding layer, but the difference in proportion of the gallium and aluminum slows the upper cladding etching process so that the etching process may be more easily stopped in the etch stop layer. A resist mask may then be applied to the remaining etch stop layer for the desired grating before resuming the etching process. It is thus clear that the etch stop layer is not essential but is part of the preferred mode for practicing the invention.

The grating layer 17 over the upper GRIN layer 16 contains a grating 18 comprised of parallel etched grooves having a spatial period $\Lambda = \lambda/2$ for first-order diffraction that produces only retroreflection of light into the active region of the layer 12 under the contact stripe 22 and a grating 19 comprised of etched grooves having a spatial period $\Lambda = \lambda$ for second-order diffraction of light that retroreflects light into the active region of the layer 12 under the stripe contact 22 and also diffracts light perpendicularly to the grating layer 17 both upwardly and downwardly. The multilayer dielectric reflector 11 reflects the downwardly reflected light back up perpendicularly to the active layer 12. In that manner, if diffraction gratings 18 and 19 are provided that are of first-order and second-order diffraction, the first-order diffraction grating 18 will cause only retroreflection into the active region under the contact 22, which is typically 250 μm long and 5 μm wide. The second-order diffraction grating 19 will cause both retroreflection into the active region and diffraction out perpendicular to the plane of the grating 19. This use of the first-order grating 18 at one end for retroreflection of light decreases the threshold of the laser as compared to the prior-art use of second-order gratings at both ends.

Figure 4:
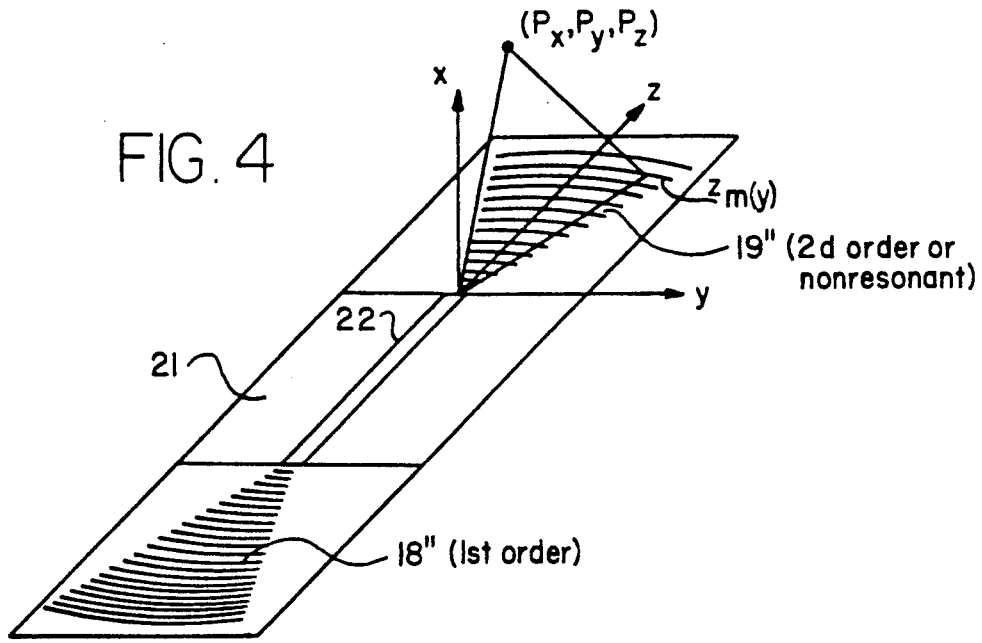
FIG. 4 illustrates schematically a variation of the diffraction gratings in FIG. 2a in which the grating at each end of the active region is curved to focus retroreflected light into a narrower active region of the laser for a lower threshold.

The preferred fabrication of this and other embodiments illustrated in the drawings is with a molecular-beam-epitaxy growth process. On the structure, 50 μm×250 μm Cr:Au contacts are evaporated onto the etched cap layer 21, except where narrower contacts are desired as shown in FIG. 4 for use with curved gratings which focus retroreflected light into the active region, and where a shorter contact is desired as shown in FIG. 5a, in which case a shorter mesa is etched in the cap layer 21. The back contact evaporated onto the substrate is AuGe/Au.

The gratings are etched utilizing electron-beam lithography with a JEOL 5DII system. The resist is developed in MIBK and etched by chemically-assisted ion beam etching (CAIBE) in $Cl_2$. By using electron-beam-lithography, it is possible to complete several devices on the same wafer, each with its own hybrid gratings. That was done for devices which were tested unmounted under short pulse conditions (500 ms at 1 KHz repetition rate).

Figure 1:
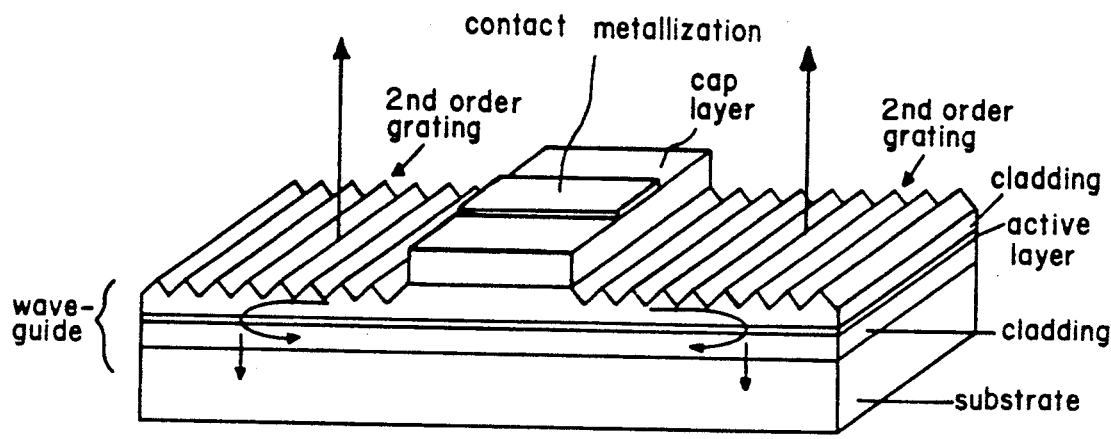
FIG. 1 illustrates a conventional grating-coupled, surface-emitting, distributed feedback (DFB) laser.
Figure 2B:
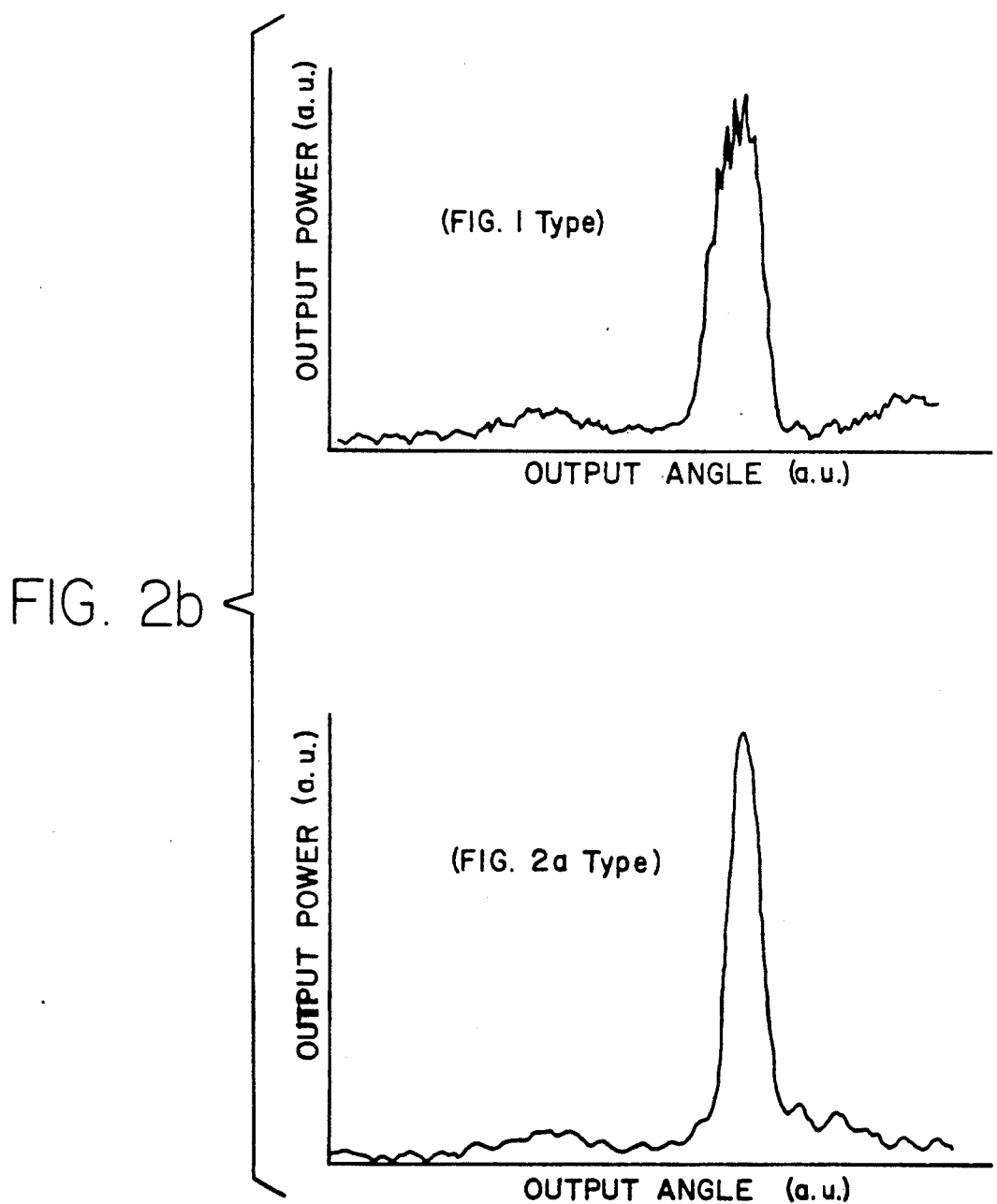

Two types of devices were fabricated for comparative testing. One type had a second-order grating at each end as in FIG. 1, and the other type had the new hybrid grating shown in FIG. 2a. FIG. 2b shows the optical power distribution in the farfield of the two types of devices. The first-order grating provided feedback only with no output coupling; the second-order grating provided both feedback and output coupling. No light was emitted from the first-order grating of the type shown in FIG. 2a, indicating not only no first-order output coupling but very low scattering loss as well, but light emitted from the second-order gratings at each end of the device of the type shown in FIG. 1 produces interference. The threshold currents for the hybrid structure of FIG. 2a are roughly two-thirds those of the conventional structure shown in FIG. 1 due to the superior feedback of the first-order grating, and the quantum efficiency is slightly higher for the hybrid structure, which is also attributed to the increased reflectivity of the first-order grating back into the active region.

The vertical farfield measured along the laser axis was plotted for both conventional and hybrid structures in FIG. 2b. Both show narrow beams with a width comparable to the diffraction limit of the 80 μm emission areas. However, since the conventional structure of FIG. 1 has two such emitting areas, there is a Young's double-slit interference pattern superimposed on the field. By contrast, the hybrid structure of FIG. 2a has an extremely smooth, single lobe, farfield pattern due to its single emission pattern.

This test of the first fabrication of a single-element hybrid first- and second-order grating surface-emitting DFB lasers has shown that they exhibit simultaneous improvements in threshold current, quantum efficiency and farfield pattern compared to conventional second-order devices made by the same fabrication process. While the quantum efficiencies for the prior-art, second-order type of device fabricated and tested were lower than some that have been reported by others of the prior-art, second-order type, other advantages of the new hybrid type will apply generally. The primary reason for the overall low quantum efficiencies in this test was scattering loss at the interface between the cap layer 21 on the waveguide layer 16; this can be eliminated by a more optimized layer structure and grating depth combination. In addition, by integrating first-order feedback gratings with more complex gratings (e.g., nonresonant gratings), multifunctional laser sources, including shaped-beam and multiple-beam lasers, become practical.

To further reduce the threshold current, both ends of the grading layer extending beyond the active region can be provided with first-order diffraction gratings having a groove spacing $\Lambda = \lambda/2$ for retroreflection of light into the active region. In that case illustrated in FIG. 3a, a first-order diffraction grating 18' is provided at both ends, and a second-order diffraction grating 19' is provided at one of the two ends of the structure in order to double retroreflect light into the active region and couple diffracted light out at one end. Since the diffraction grating 19' is provided with a groove spacing $\Lambda = \lambda$, the light is coupled out perpendicularly. Alternatively, if the grating 19' is provided with a groove spacing $\Lambda$ that is neither equal to $\lambda$ nor $\lambda/2$, nonresonant diffraction is provided to couple light out at some angle $\theta$ other than 90° from the plane of the upper guiding layer, where the relation between the angle of diffraction $\theta$ and the period of the nonresonant grating is given below by Equation (3). This variation is illustrated schematically in FIG. 3b.

There are two different methods by which a multiperiod grating may be implemented. One method illustrated in FIGS. 3a and 3b spatially separates the two gratings. Another method shown in FIG. 3c combines the two gratings into a single grating structure by alternating wide and narrow grooves as shown in FIG. 3c, such that the widely-spaced grooves have a period $\lambda$ to provide coupling out, and the widely and narrowly spaced grooves together provide a grating having an average period $\lambda/2$ to retroreflect light into the active region of the laser. It is thus possible to create a grating that contains spatial frequencies that provide an enhanced feedback through first-order retroreflection along with output coupling from a second-order grating.

In each of the variations shown in FIGS. 3a, 3b and 3c, the diffraction grating at each end of the active region defined by the stripe contact 22 may be curved to focus the light retroreflected into the active region in order to lower the threshold of the laser, as illustrated schematically in FIG. 4 by gratings 18" and 19". With such focusing in place, it is possible to make the stripe contact 22, and therefore the active region, narrower (5 μm or less) and to make it longer (500 μm long) for greater power output. This has the effect of concentrating the optical field in the active region for maximum efficiency with a lower threshold.

It is also possible to shorten the stripe contact, as illustrated schematically in FIG. 5a, and therefore to reduce the size of the active region. This provides a laser with a lower threshold and smaller chip area. In principle, the grating reflectivity may be made sufficiently high that the required material gain does not exceed what is supplied by a single quantum well, but for lower grating reflectivities, the number of quantum wells may be raised to supply sufficient gain in the short cavity.

To further boost the power of the light coupled out, all curved gratings 18" and 19" may be provided as segments of concentric circles with a groove spacing $\Lambda = \lambda$ for a second-order diffraction. And to lower the threshold, additional feedback reflection may be provided by providing a first-order diffraction section inside the concentric second-order gratings 18" and 19", or combining the second-order and the first-order gratings using the technique described hereinbefore With reference to FIG. 3c. (This technique for combining two grating structures into one may be used to improve the performance of many different surface-emitting laser geometries, including curved gratings.) Light is then diffracted out on a perpendicular axis by both gratings, as shown. An annular surface emitting laser is thus provided, and the low threshold characteristic of the device is retained.

The periodicity of a portion of the curved grating may also be chosen to focus the light to a point above the laser.

Figure 7:
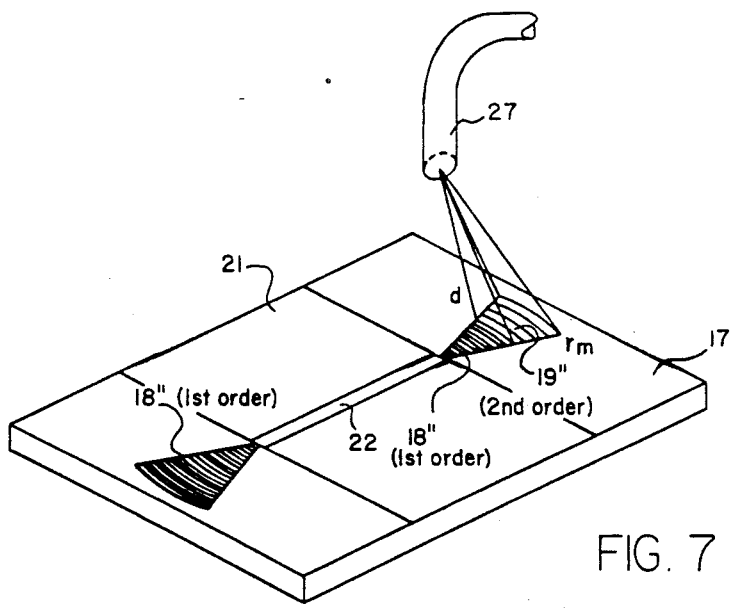
FIG. 7 illustrates schematically another application of a DFB laser in which curved first-order diffraction gratings are provided at each end and a curved nonresonant diffraction grating is provided at one end for coupling a focused output beam of light into an optical fiber.

The condition on the radius of the mth groove (denoted by $r_m$) for the output light to be focused to a point P directly above the output facet of the active region as shown in FIG. 7 is that the optical path length from the output facet to groove m to point P is equal to $d + m\lambda_o$, where $\lambda_o$ is the wavelength in air. This condition can be written:

$$nr_m + \sqrt{d^2 + r_m^2} = d + m\lambda_o. \qquad (2)$$

In the case of a curved second-order or a curved nonresonant grating 19", the light is focused at a point P above the laser surface.

It is also possible to choose the shape of the groove such that the focal point P is at an arbitrary location above the laser surface. In this case, the groove shape is not circular and must be specified parametrically. For a narrow stripe, in which the optical field at the end of the stripe may be approximated by a point source, this condition is:

$$\sqrt{P_x^2 + P_y^2 + P_z^2} + m\lambda_o = \qquad (3)$$
$$n\sqrt{z_m^2(y) + y^2} + \sqrt{P_x^2 + (P_y - y)^2 + (P_z - z_m(y))^2}$$

in which ($P_x$, $P_y$, and $P_z$) are the x,y, and z coordinates of the focal point; and $z_m(y)$ is a parametric representation of the mth groove in the coordinate system shown in FIG. 4. This equation may be solved numerically for $z_m(y)$ for a given focal point P.

Figure 5B:
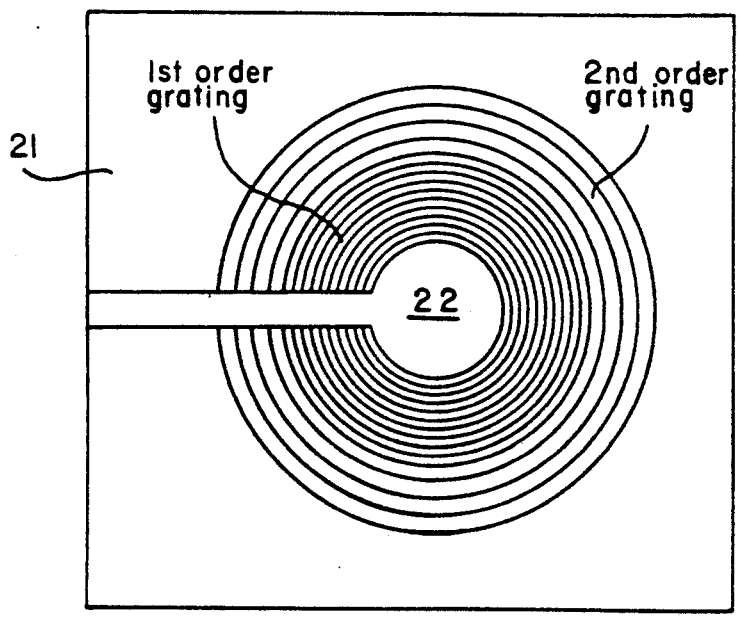
FIG. 5b illustrates combining multiple grating periods into a single annular grating to provide an annular Bragg reflector, surface-emitting DFB laser.

The benefits of combining multiple grating periods into a single device as previously described may be included in an annular Bragg DFB laser in which first- and second-order gratings are combined in concentric circular grooves as shown schematically in FIG. 5b.

If a curved diffraction grating is provided with a groove spacing $\Lambda = \lambda/2$ at both ends of an active region, and an additional curved diffraction grating is provided at one end with a groove spacing $\Lambda$ neither equal to $\lambda$ or $\lambda/2$, but meeting the condition described in Equation (3), focused light can be caused to be diffracted at some angle $\theta$ in a vertical plane other than 90°. This permits the surface emitting laser to be used as a focused light source, for example to probe an optically modulated disk that is in a plane parallel to the laser, and detecting light that is reflected from the disk onto a photodiode fabricated on the laser chip some distance from the laser so that a monolithic read head is provided for a compact optically recorded disk. By satisfying the conditions described in Equation (2), focusing of the light coupled out of the laser to a point in a vertical plane can be achieved, i.e., focusing at a point P on the vertical axis X. This special case is useful, for example, in coupling focused light into the end of an optical fiber.

Figure 6:
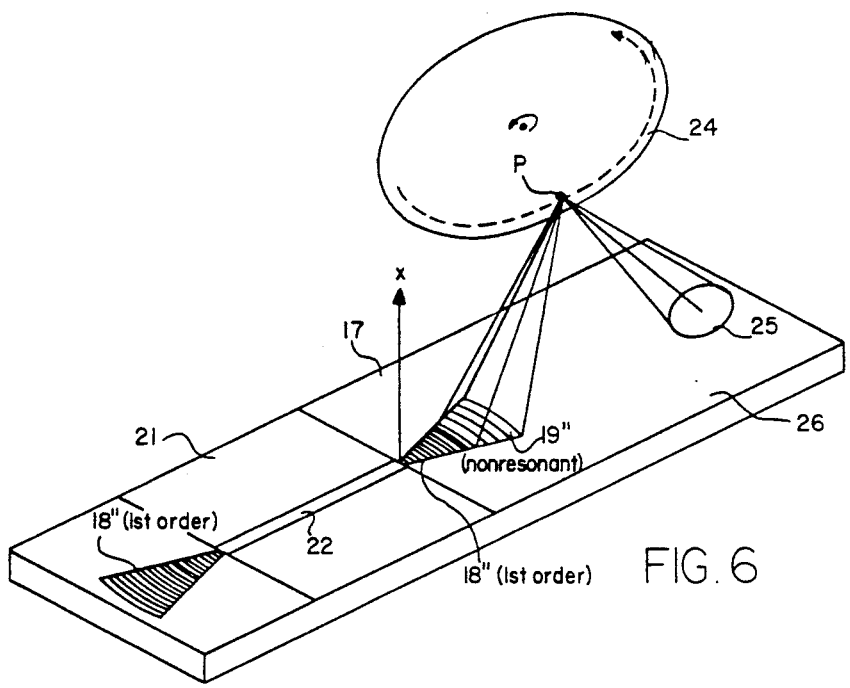
FIG. 6 illustrates schematically how the DFB laser of FIG. 4 may be made on a semiconductor chip together with a light detector for use as a monolithic optical read head for a recorded laser disk.

It is apparent that an important application for the present invention is to provide a monolithic optical read head for compact laser recorded disk. This is accomplished, as illustrated in FIG. 6, by providing a DFB laser with curved first-order gratings 18" at one end to retroreflect focused light into the active region under the stripe contact 22, and with a combination of a curved first-order grating 18" and a curved nonresonant grating 19" at the other end to focus output light to a point P as described with reference to Equation (3). By placing the focal point P at some distance from the vertical axis X, it is possible to achieve lensless coupling of a focused beam of light onto a track of a laser recorded disk positioned to rotate in a plane parallel to the surface-emitting DFB laser. Since the angle of incidence of the focused light beam is not 90°, the recorded laser disk 24 will reflect modulated light back onto the chip of the laser at a spot 25 displaced from the laser. A photodetector may then be fabricated on the semiconductor chip 26 at the spot 25 to provide a monolithic optical read head for digitally recorded disks, such as audio or video optical disks. There are several advantages to that arrangement. One advantage is that such a read head has very low mass which greatly reduces problems encountered in designing the electromechanical system for controlling the position of a read head over the recorded optical disk.

Another application for the present invention described above with reference to Equation (2) and FIG. 4 is to couple vertically focused output light into the polished end of an optical fiber 27 as illustrated in FIG. 7. A modulated signal applied to the stripe contact is thus converted into surface-emitting laser light that is focused into an optical fiber for transmission.

All of these variations utilize the same organization for a planar semiconductor laser described with reference to FIG. 2a. The differences between the various embodiments shown are only in the dimensions of the stripe contact and the geometry of gratings, both of which can be readily altered by changing the masks for metalization of the contact stripe and etching the gratings.

Although particular arrangements and variations of the invention have been described and illustrated herein, it is recognized that other arrangements and variations may readily occur to those skilled in the art. Consequently, it is intended that the claims be interpreted to cover such arrangements and variations.

I claim:

1. A semiconductor grating-coupled, surface-emitting, distributed feedback laser comprising a semiconductor chip, an active region and waveguide parallel to a surface of said semiconductor chip, and hybrid grating structures on exposed surfaces of said waveguide, said hybrid grating structures utilizing both first-order and other gratings selected from a group consisting of second-order gratings and nonresonant gratings having periodic groove spacing $\Lambda=\lambda/2$ and $\Lambda=\lambda$ for respective first and second order gratings, and $\Lambda$ not equal to $\lambda/2$ or $\lambda$ for nonresonant gratings, where $\lambda$ is the wavelength of emitted light in said waveguide to separately provide feedback from first-order and second-order gratings and coupling light out of said waveguide from second-order and nonresonant gratings.

2. A distributed feedback laser as defined in claim 1 wherein said hybrid grating structure comprises a first-order grating at one end of said active region for retroreflection of light into said active region, and a second-order grating at an end opposite said one end of said active region for retroreflection of light into said active region and diffraction of light perpendicular to said semiconductor chip surface for coupling light out of said laser.

3. A distributed feedback laser as defined in claim 1 wherein said hybrid grating structure comprises a first-order grating at each end of said active region for retroreflection of light into said active region, and a second-order grating at one end of said active region for diffraction of light perpendicular to said semiconductor chip surface for coupling light out of said laser.

4. A distributed feedback laser as defined in claim 1 wherein said hybrid grating structure comprises a first-order grating at one end of said active region for retroreflection of light into said active region, and a combination of gratings at an end opposite said one end of said active region consisting of a first-order grating for retroreflection of light into said active region and a nonresonant grating for diffraction of light at an angle above said semiconductor chip surface.

5. A distributed feedback laser as defined in claim 3 wherein said angle of diffraction and the required period of nonresonant grating may be determined from Bragg relations $$\theta = \text{Arccos}\left(n - \frac{\lambda_o}{\Lambda}\right)$$

$$\Lambda = \frac{\lambda_o}{\cos\theta - n}$$

in which $\theta$ is the angle of diffraction, n is the effective index of refraction of said waveguide material, $\lambda_o$ is the wavelength of the laser light in air, and $\Lambda$ is the local period of said nonresonant grating.

6. A distributed feedback laser as defined in claim 1 wherein said hybrid grating structure comprises a first-order grating at one end of said active region for retroreflection of light into said active region, and a multiperiod grating at an end opposite said one end of said active region for retroreflection of light into said active region and for diffraction of light at an angle from said semiconductor chip surface for coupling light out of said laser.

7. A distributed feedback laser as defined in claim 6 wherein said multiperiod grating is provided by alternating widely and narrowly spaced grooves such that the narrowly spaced grooves have an average period equal to $\lambda/2$ for retroreflection of light into said active region, and said widely spaced grooves have a period not equal to $\lambda/2$ for coupling light out of said laser at an angle other than 90° from said semiconductor chip surface.

8. A distributed feedback laser as defined in claim 6 wherein said multiperiod grating is provided by alternating widely and narrowly spaced grooves such that narrowly spaced grooves have an average period equal to $\lambda/2$ for retroreflection of light into said active region and said widely spaced grooves have a period equal to $\lambda$ for coupling light out of said laser perpendicular to said semiconductor chip surface.

9. A distributed feedback laser as defined in claim 2 wherein grooves of said first-order grating are curved to focus light retroreflected into said active region and grooves of said second-order grating are curved to focus light retroreflected into said active region and to diffract light out of said laser perpendicular to said semiconductor chip surface.

10. A distributed feedback laser as defined in claim 3 wherein grooves of said first- and second-order gratings are curved to retroreflect light into said active region and to diffract light out of said laser at said one end perpendicular to said semiconductor chip surface.

11. A distributed feedback laser as defined in claim 10 wherein the curvature of said first- and second-order grating grooves is chosen so that each groove, taken independently, retroreflects focused light into said active region of said laser and the radius of curvature is given approximately by the distance of the groove from the end of said active region, such that all grooves of each grating are segments of concentric circles.

12. A distributed feedback laser as defined in claim 10 wherein a more accurate specification for the shape of each groove consists of specifying the spacing of each point along a groove from the end of said active region so as to provide lines of constant phase in the distribution of the optical field as it exits said active region.

13. A distributed feedback laser as defined in claim 10 wherein said active region is shortened to at least less than 10 μm, and said first- and second-order gratings curved to retroreflect light into said active region at each end of said active region are annular in shape, whereby said second-order grating is provided at both ends to produce an output beam perpendicular to said semiconductor chip surface of said laser consisting of light from both ends of said shortened active region.

14. A distributed feedback laser as defined in claim 13 wherein said active region is circular and is defined by an annular grating for feedback and output coupling.

15. A distributed feedback laser as defined in claim 4 wherein grooves of said first-order gratings for retroreflection of light are curved to focus light into said active region and grooves of said nonresonant grating for diffraction of light in a direction above said surface are curved to focus light to a point above said semiconductor chip surface.

16. A distributed feedback laser as defined in claim 15 wherein said grooves of said nonresonant grating for focusing light out of said waveguide to said point above said semiconductor chip surface are circularly shaped such that the mth groove has a radius of curvature, $r_m$, for the output light of said active region to be focused to a point P directly above the output of said active region so that the optical path length from said output facet to groove m and from groove m to said point P is equal to $d + m\lambda_o$, where d is the height of said point P above said surface of said waveguide and $\lambda_o$ is the wavelength of said light in air, a condition that can be written as $$nr_m + \sqrt{d^2 + r_m^2} = d + m\lambda_o$$

where n is the effective index of refraction of said waveguide.

17. A distributed feedback laser as defined in claim 15 wherein grooves of gratings for coupling light out of said waveguide are approximately circularly shaped such that the mth groove has a radius of curvature, $r_m$, for the output light of said active region to be focused to a spot approximately centered on point P at an arbitrary location above said laser surface to satisfy the following condition:

$$\sqrt{P_x^2 + P_y^2 + P_z^2} + m\lambda_o = n\sqrt{z_m^2(y) + y^2} + \sqrt{P_x^2 + (P_y - y)^2 + (P_z - z_m(y))^2}$$

in which $P_x$, $P_y$, and $P_z$ are the x, y, and z coordinates of said point; and $z_m(y)$ is a parametric representation of the mth groove in the coordinate system of mutually perpendicular axes, where x is an axis perpendicular to said laser surface at an output facet of said active region, z is an axis on said surface of said laser and is an extension of a center line of said active region, and y is an axis on said surface of said laser and is perpendicular to both the x and y axes.

18. A semiconductor grating-coupled, surface-emitting distributed feedback laser fabricated with a photodetector spaced from said distributed feedback laser in a semiconductor chip to provide a monolithic read head for a laser recorded disk, said distributed feedback laser having an active region and a waveguide parallel to a surface of said semiconductor chip and incorporated hybrid grating structures on exposed surfaces of said waveguide, said hybrid grating structures including a first-order grating at each end of said active region for retroreflection of light into said active region and a nonresonant grating at one end of said active region for diffraction of light to a point of focus above said surface, wherein said point of focus is on a laser recorded disk and said photodiode is spaced from said distributed feedback laser for reception of light reflected from said point of focus on said laser recorded disk.

* * * * *